United States Patent [19]

Hakanen et al.

[11] Patent Number: 4,945,633
[45] Date of Patent: Aug. 7, 1990

[54] METHOD OF MOUNTING A PRINTED CIRCUIT BOARD AND SECURING THE EARTHING TO A CASING

[75] Inventors: Pekka Hakanen, Turku; Lassi Lahti, Salo; Jari Suutari, Halikko; Eero Sirkiä, Salo; Timo Kallioinen, Forssa; Heikki Nieminen, Toijala; Seppo Alaspää, Tikkakoski; Kari Salo, Salo; Harri Halonen, Rovaniemi; Markku Rauhanummi, Paimio, all of Finland

[73] Assignee: Nokia-Mobira Oy, Salo, Finland

[21] Appl. No.: 317,573

[22] Filed: Mar. 1, 1989

[51] Int. Cl.⁵ .............................................. H05K 9/00
[52] U.S. Cl. .................................. 29/825; 174/35 R; 361/399; 361/424
[58] Field of Search ............ 174/35 R, 35 G C, 35 C, 174/51, 52.1; 361/424, 399; 29/825, 857

[56] References Cited

U.S. PATENT DOCUMENTS 4,091,232  5/1978  Lenk et al. ........................ 174/35 R
4,226,491 10/1980  Kazama et al. ..................... 361/399

Primary Examiner—Leo P. Picard
Assistant Examiner—Bot LeDynh
Attorney, Agent, or Firm—Darby & Darby

[57] ABSTRACT

Method of mounting a printed circuit board and securing the earthing to a casing. The method includes providing the printed circuit board with projecting parts and an earthing connection on at least one face, providing the casing with corresponding recesses, mounting the printed circuit board so that the projecting parts fit into the recesses to support the board, attaching a flexible sealing strip of electrically conducting material, and placing a lid on the sealing strip, whereby the earthing connection contacts the casing and the sealing strip, securing the earthing connection.

5 Claims, 1 Drawing Sheet

METHOD OF MOUNTING A PRINTED CIRCUIT BOARD AND SECURING THE EARTHING TO A CASING

BACKGROUND OF THE INVENTION

1. Field of the Invention

This invention relates to a method of mounting a printed circuit board in a casing, and more specifically to a method of mounting a printed circuit board into a radio frequency shielding casing, the casing having an electrically conducting surface, and securing the earthing between the printed circuit board and the casing.

2. Description of the Prior Art

Electronic equipment operating in the radio frequency range is conventionally installed in metal casings, in order to ensure a shielded environment free of interference from the outside and also to prevent the equipment itself from radiating disturbances to the environment. There may be several units in the same casing, which then is divided into compartments by walls. Usually, in order to ensure a good radio frequency shielding, the casing and the compartments are closed with a metal lid, a sealing strip of electrically conducting material running between the edges of the casing and the lid.

The earthing of the printed circuit boards is conventionally provided by a contact between the earthing strip on the printed circuit board and the casing. This is in most cases feasible at those points where the board is fastened to the casing, e.g. by screws. Alternative earthing contacts have been made with other mechanical arrangements, such as springs, clips and the like.

The conventional mounting methods then need space on the printed circuit boards for screws and the like, which reduces the available space for components, or necessitates correspondingly larger printed circuit boards. On the other hand, the fastening by screws traditionally requires special studs to be molded in the casing and provided with threading for the fastening screws.

The conventional mounting methods require many separate components many manufacturing phases, including precision machining and manual work.

SUMMARY OF THE INVENTION

It is an object of the present invention to provide an improved method of mounting a printed circuit board and securing the earthing to a casing, overcoming the drawbacks of the prior art mentioned above.

According to the invention there is provided a method of mounting a printed circuit board into a radio frequency shielding casing, the casing having an electrically conducting surface, and securing the earthing between the printed circuit board and the casing, the method comprising the steps of:

providing the printed circuit board with projecting parts on at least two sides of the printed circuit board, and arranging earthing means on the printed circuit board to extend on at least one face of said projecting parts;

providing the edges of the casing with a corresponding number of recesses dimensioned and positioned so as to tightly receive said projecting parts therein;

mounting the printed circuit board into the casing so that the projecting parts fit into the recesses to support the printed circuit board in the casing, the outer face of the printed circuit board situated at least as low as the plane defined by the edges of the casing;

attaching a flexible sealing strip of electrically conducting material along the edges of the casing continuing over the projecting parts; and placing a lid on said sealing strip, tightening the lid against the sealing strip and securing the lid to the casing.

Preferably, said projecting parts are provided as integral parts of the printed circuit board. Suitably, the method further includes the step of providing the earthing means on both faces of the projecting parts of the printed circuit board.

Suitably the recesses of the casing are provided to a depth exceeding the thickness of the printed circuit board by a predetermined distance less than the thickness of the flexible sealing strip. The lid may also be provided with swelling portions at the locations of the recesses and at the side facing the sealing strip.

The casing and the lid may constitute homogeneous metal parts or they may be of some other material covered with an electrically conducting surface layer.

BRIEF DESCRIPTION OF THE DRAWINGS

The invention is further described by way of example with reference to the accompanying drawing, in which.

DETAILED DESCRIPTION OF THE PREFERRED EMBODIMENTS

Figure 1:
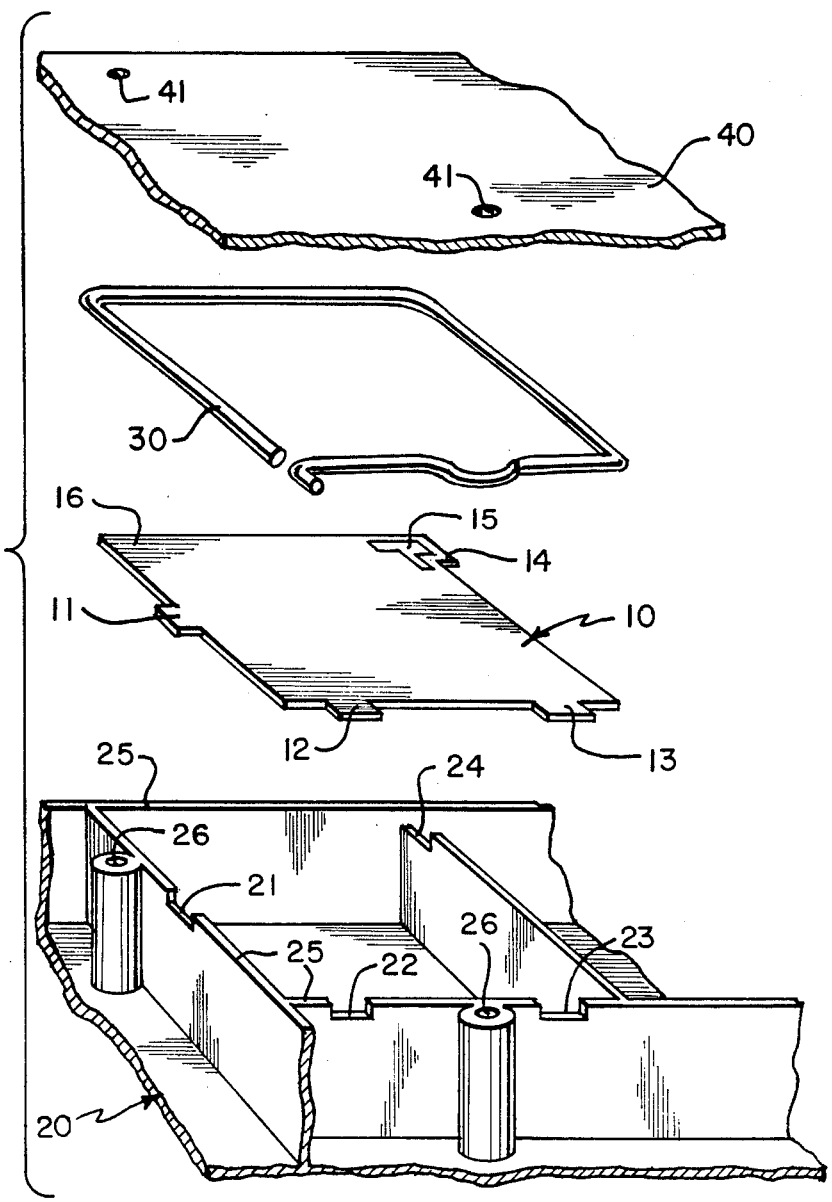
FIG. 1 illustrates schematically in a perspective view the arrangement for carrying out the method according to the invention.

The accompanying drawing shows in FIG. 1 a printed circuit board 10, which according to the invention is provided with projecting parts 11, 12, 13, 14. The earthing means 15 (printed circuit conductors) are provided on both faces of the printed circuit board and of the projecting parts (16 and 17 in FIG. 2). The number and the location of the projecting parts may vary in accordance with individual requirements.

The casing 20 is provided with recesses 21, 22, 23, 24 on the edges 25 at locations corresponding to the projecting parts 11, 12, 13, 14, the recesses provided with a depth equalling the thickness of the printed circuit board plus a distance L (cf. FIG. 2), and a width that allows them to receive the respective projecting parts with a small clearance.

The printed circuit board 10 is mounted in the casing 20 by placing the projecting parts in the corresponding recesses. Then the outer face 16 of the board will be a distance L away from the plane defined by the edges 25 to allow a space between the printed circuits and the lid 40. The components on the printed circuit board will "hang" downwards in the casing. The board 10 is then firmly held in place against movement in the board's plane.

A commercially available flexible sealing strip 30 of electrically conducting material (plastic or synthetic rubber, with a metallic surface or including metal particles) is placed along the edges 25 so that the strip continues over the recesses and over the projecting parts 11, 12, 13, 14. The sealing strip 30 may be applied in several parts, the ends of which are placed so that they contact adjacent parts, thereby creating a continuous ring of electrically conducting sealing strip around the edges of the casing compartment.

The fastening of the printed circuit board is provided by placing a metal lid 40 over the casing 20 so that the sealing strip will be compressed between them when the lid 40 is fastened to the casing. The fastening is completed by tightening screws (not shown) through bores 41 in the lid to the studs 26 in the casing.

Figure 2:
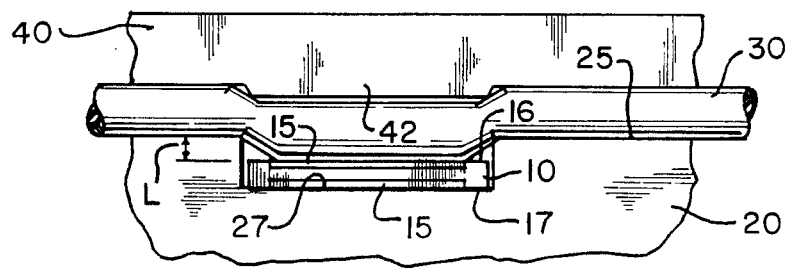
FIG. 2 shows in an end view one projecting part of a printed circuit board mounted in a casing and fastened between the casing and the lid, according to the inventive method.

The situation for one projecting part after fastening of the lid is shown schematically in FIG. 2.

The projecting part (11, 12, 13 or 14) is firmly held in the recess (21, 22, 23 or 24) by the pressure applied through the sealing strip 30. The electrically conducting earthing means 15 (printed circuit conductors) on both faces 16 and 17 of the printed circuit board 10 are then contacting the bottom of the recess 27 and the sealing strip 30 respectively, thereby securing the earthing of the printed circuit board 10 to the casing 20.

To enhance the pressure on the printed circuit board, the lid is provided with a swelling 42 somewhat narrower than the recess. Although the clearances between the sides of the projecting part and the recess are small, there may be vibrating installation environments, where the best friction (fastening) is achieved with a radio frequency sealing strip of synthetic, rubber-like composition blended with electrically conducting metal particles.

The inventive method described above dispenses with screws and other laborious fastening of the printed circuit board. This leads to easy handling e.g. by service personnel; the printed circuit board may be removed at once when the lid is taken off the casing.

Applications of the principles of the invention in this and similar manners are all intended to fall within the scope of the invention.

What is claimed is:

1. A method of mounting a printed circuit board into a radio frequency shielding casing, the casing having an electrically conducting surface, and securing the earthing between the printed circuit board and the casing, characterized in that the method comprises the steps of:

provided the printed circuit board with projecting parts on at least two sides of the printed circuit board, and arranging earthing means on the printed circuit board to extend on at least one face of said projecting parts;

providing the edges of the casing with a corresponding number of recesses dimensioned and positioned so as to receive said projecting parts therein;

mounting the printed circuit board into the casing so that the projecting parts fit into the recesses to support the printed circuit board in the casing, the outer face of the printed circuit board situated at least as low as the plane defined by the edges of the casing;

attaching a flexible sealing strip of electrically conducting material along the edges of the casing continuing over the projecting parts; and placing a lid on said sealing strip, tightening the lid against the sealing strip and securing the lid to the casing.

2. The method as claimed in claim 1, characterized in that said projecting parts are provided as integral parts of the printed circuit board.

3. The method as claimed in claim 2, characterized in that it further includes the step of providing the earthing means on both faces of the projecting parts of the printed circuit board.

4. The method as claimed in claim 1, characterized in that the recesses in the edges of the casing are provided to a depth exceeding the thickness of the printed circuit board by a predetermined distance less than the thickness of the flexible sealing strip.

5. The method as claimed in claim 4, characterized in that the lid is provided with swelling portions at the locations of the recesses and at the side facing the sealing strip.

* * * * *